United States Patent [19]

Cory

[11] Patent Number: 5,208,536
[45] Date of Patent: May 4, 1993

[54] METHOD FOR SLICE SELECTION IN AN NMR MAS SOLIDS IMAGING SYSTEM

[75] Inventor: David G. Cory, Boston, Mass.

[73] Assignee: Bruker Instruments, Inc., Billerica, Mass.

[21] Appl. No.: 724,876

[22] Filed: Jul. 2, 1991

[51] Int. Cl.$^5$ .......................................... G01R 33/20
[52] U.S. Cl. ................................. 324/321; 324/307
[58] Field of Search ................ 324/321, 309, 307, 300

[56] References Cited

U.S. PATENT DOCUMENTS

| | | | |
|---|---|---|---|
| 3,530,374 | 9/1970 | Haeberlen et al. | 324/311 |
| 3,781,650 | 12/1973 | Keller | 324/311 |
| 4,301,410 | 11/1981 | Wind et al. | 324/321 |
| 4,443,761 | 4/1984 | Levitt | 324/311 |
| 4,470,014 | 9/1984 | Levitt et al. | 324/311 |
| 4,486,709 | 12/1984 | Bendall | 324/307 |
| 4,510,449 | 4/1985 | Ernst et al. | 324/309 |
| 4,521,732 | 6/1985 | Pegg et al. | 324/300 |
| 4,654,593 | 3/1987 | Ackerman | 324/307 |
| 4,682,107 | 7/1987 | Bendall et al. | 324/307 |
| 5,099,206 | 3/1992 | Imaizumi et al. | 324/307 |

OTHER PUBLICATIONS

Frequency-Switched Pulse Sequences: Homonuclear Decoupling and Dilute Spin NMR in Solids, Bielecki et al.
Heteronuclear Correlation Spectroscopy in Rotating Solids, Caravatti et al.
Heteronculear Solid-State Correlation Spectroscopy, Caravatti et al.
Two-Dimensional Heteronculear Chemical Shift Correlation Spectroscopy in Rotating Solids, Roberts et al.
Low-Power Multipulse Line Narrowing in Solid-State NMR, Burum et al.
NMR Images of Rotating Solids, D. G. Cory et al.
"Time-Suspension Multiple-Pulse Sequences: Applications to Solid-State Imaging", D. G. Cory, J. B. Miller and A. N. Garroway Journal of Magnetic Resonance, vol. 90, pp. 205-213 (1990).
"Selective Excitation in Fourier Transform Nuclear Magnetic Resonance", G. A. Morris and R. Freeman, Journal of Magnetic Resonance, vol. 29, p. 433 (1978).
"A Simple Pulse Sequence for Selective Excitation in Fourier Transform NMR", G. Bodenhausen, R. Freeman and G. A. Morris, Journal of Magnetic Resonance, vol. 23, p. 171 (1976).
"Multiple-Pulse Methods of 1H N.M.R. Imaging of Solids: Second Averaging", D. G. Cory, J. B. Miller, R. Turner and A. N. Garroway, Molecular Physics, v. 70, n. 2, pp. 331-345 (1990).

Primary Examiner—Michael J. Tokar
Assistant Examiner—Raymond Y. Mah
Attorney, Agent, or Firm—Wolf, Greenfield & Sacks

[57] ABSTRACT

A multiple-pulse RF pulse sequence applied in the presence of an oscillating magnetic field gradient enables slice selection in a magic angle spinning nuclear magnetic resonance solids imaging system. Slice selectivity is produced by a series of RF pulses, some of which introduce a nutation that coherently adds for only a selected slice plane of the sample and averages to zero in other areas and some of which average certain gradient-induced modulations so that only those object areas in the selected slice contribute to the output. The pulse train is applied in a manner synchronous with rotor rotation so that rotation induced modulations average to zero over one or more rotor rotation periods.

24 Claims, 3 Drawing Sheets

METHOD FOR SLICE SELECTION IN AN NMR MAS SOLIDS IMAGING SYSTEM

FIELD OF THE INVENTION

This invention relates to imaging of solids produced by nuclear magnetic resonance (NMR) imaging of NMR active nuclei and, in particular, to methods for electronically selecting spatial slices in a magic angle spinning (MAS) NMR imaging system.

BACKGROUND OF THE INVENTION

Nuclear magnetic resonance is a phenomenon exhibited by a select group of atomic nuclei and is based upon the existence of nuclear magnetic moments in these nuclei (termed "NMR active" nuclei). When an NMR active nucleus is placed in a strong, uniform and steady magnetic field, the spin magnetization of the nucleus precesses at a natural resonance frequency known as the Larmor frequency, which is characteristic of each nuclear type and is proportional to the applied field strength at the location of the nucleus. Typical NMR active nuclei include $^1H$ (protons), $^{13}C$, $^{19}F$ and $^{31}P$. The resonant frequencies of the nuclei can be observed by monitoring with an RF receiver the transverse magnetization which results after a strong RF pulse is applied at, or near, the Larmor frequency. It is common practice to convert the measured signal to a frequency spectrum by means of Fourier transformation.

In order to use the NMR phenomenon to obtain an image of a sample, a magnetic field is applied to the sample, along with a magnetic field gradient which depends on physical position so that the field strength at different sample locations differs. When a field gradient is introduced, as previously mentioned, since the Larmor frequency for a particular nuclear type is proportional to the applied field strength, the Larmor frequencies of the same nuclear type will vary across the sample and the frequency variance will depend on physical position. By suitably shaping the applied magnetic field and processing the resulting NMR signals for a single nuclear type, a nuclear spin density image of the sample can be measured. Because the NMR signal which is measured is a function of the total number of nuclei of a given type, it is common to use a nucleus which is found in abundance in the sample to be imaged. For example, $^1H$ (protons) are commonly used because they are abundant in many materials and therefore, generate a large NMR signal.

The observed resonance frequency for a given nuclear type is the sum of the Larmor frequency and small frequency shifts due to a variety of factors. Consequently, a complex spectrum of frequencies is typically observed in the absence of a magnetic field gradient. Because the observed frequency dependence on nuclear position is the basis for forming an image, in order to resolve two spatially-distinct, but physically-adjacent position elements, the magnetic field gradient strength must be increased to a point where the resonance frequency of nuclei in each element are shifted from each other by an amount which is greater than the natural spread in resonance frequencies.

Aside from a practical limit on the magnetic field gradient strength which can be generated with existing equipment, increasing the gradient strength also broadens the total spread of resonant frequencies over the entire sample width. As all of these frequencies must be accommodated by the RF receiver, the bandwidth of the receiver must also be increased. Noise enters the receiver in proportion to the square root of the receiver bandwidth so that as the magnetic gradient strength increases, additional redundant measurements must be taken to extract the signal from the noise. Since the redundant measurements require extra time, the amount of time needed to acquire an image therefore also places a practical limit on the image resolution. Consequently, most prior art techniques for increasing image resolution have attempted to reduce the resonance line width as much as possible rather than increasing the magnetic field gradient.

For spin$=\frac{1}{2}$ nuclei and for systems in which quadrupole effects can be neglected, the natural resonance line width in a sample is generally most influenced by three factors: dipolar couplings, chemical shifts and susceptibility broadening. Dipolar couplings result from interactions between the magnetic moments in neighboring nuclei. If the neighboring nuclei are of the same type, the perturbations are called homonuclear dipolar couplings and tend to broaden the characteristic resonance lines and reduce image resolution (for protons, homonuclear dipolar couplings are the most serious broadening factor). In liquids, the field perturbations induced by dipolar couplings are time averaged to zero by the continuous motion of individual molecules and thus do not severely affect image resolution, but in solids, these couplings can give rise to very large static magnetic field components which can be as much as several Gauss for interacting protons. A field perturbation of this magnitude can significantly widen a resonance peak and reduce image resolution.

Chemical shifts are also an important source of line broadening. More particularly, although identical nuclei have the same frequency dependence upon the magnetic field, differences in the chemical environment of each nucleus can modify the applied magnetic field in the local vicinity of the nucleus, so that nuclei in the same sample do not experience the same net magnetic field. The differences in the local magnetic field result in slight spectral shifts in the Larmor frequencies between two such chemically non-equivalent nuclei, called "chemical shifts" which tend to broaden the spread of resonance frequencies and reduce image resolution.

The chemical shifts have a component which is anisotropic in that it depends on the particular orientation of a molecule to the applied Zeeman field and an isotropic part which is independent of the applied field direction. In liquids, the rapid molecular motion tends to average out the anisotropic parts of the chemical shifts leaving the isotropic parts. However, in solids, the orientation of the solid molecules is relatively fixed with respect to the applied Zeeman field and, accordingly, the anisotropic chemical shift components do not average to zero, resulting in peak broadening.

Susceptibility broadening occurs because the bulk magnetic susceptibility of the sample varies across the sample. Variations in the bulk susceptibility disrupt the uniform magnetic field applied to the sample and create local fluctuations in the field strength. Since the Larmor frequency is proportional to the applied magnetic field strength, the local fluctuations cause line broadening when averaged over the entire sample.

Therefore, in solids imaging systems, it is important to suppress homonuclear dipolar couplings, chemical shifts and susceptibility broadenings (chemical shifts and susceptibility broadenings are referred to collectively as "inhomogeneous" broadenings) in order to obtain high resolution without increasing the magnetic field gradient.

Further, one of the most useful NMR parameters is the isotropic chemical shift which can be used to resolve two or more chemicals in a sample mixture. However, as mentioned above, in a solid, the isotropic chemical shift is generally obscured by the anisotropic chemical shift. For example, in a sample consisting of a mixture of paradimethoxy benzene and hexamethyl benzene, the resulting NMR output spectrum is approximately 50 Khz wide. This width can be reduced to a few parts per million using conventional line narrowing techniques, such as the MREV-8 radio frequency pulse sequence, to remove dipolar coupling effects. However, even with this conventional line width reduction, the spectral width of the paradimethoxy benzene (about 15 ppm) resulting from the anisotropic chemical shift is still wide enough to encompass and obscure the spectrum resulting from the hexamethyl benzene which is about 4 ppm wide but lies within the paradimethoxy benzene spectrum.

One prior art method of reducing some of the aforementioned broadenings and the anisotropic chemical shift consists of orienting the solid sample at the "magic angle" (54°44') with respect to the applied Zeeman field and physically rotating the solid at a relatively rapid rate thereby causing the anisotropic parts of the perturbing components to average to zero. This technique is called "magic angle spinning" or MAS. In this case, for imaging purposes, the magnetic field gradient may also rotate in synchronism with the rotating sample so that the sample experiences a "constant field gradient". Since the isotropic chemical shift information is preserved, the MAS method allows many chemical mixtures to be resolved.

In the aforementioned example, MAS can reduce the spectral width of the paradimethoxy benzene spectrum to the point where it no longer encompasses the spectrum of the hexamethyl benzene so that the compounds can be resolved. It is then possible to use conventional techniques to select one line or a small group of spectral lines corresponding to one compound in a mixture of compounds in order to acquire an image. For example, either the spectral lines of paradimethoxy benzene or the spectral line of hexamethyl benzene of the previous example could be used to acquire an image to find the spectral properties of the sample mixture resulting from the fraction of the sample consisting of the selected compound.

In many imaging studies it is desirable to obtain an image from only a thin section or slice of an object in order to reduce the time needed to acquire the image data from the time needed for a full three dimensional image. Most NMR images are obtained as a two dimensional array of data points which are generated from a two dimensional slice of the test object. The thickness of the slice is usually determined prior to the imaging experiment either by physically cutting the object into a wafer or a slice and placing the physical slice into the NMR spectrometer or by placing the entire object into the spectrometer and relying on an NMR experiment to selectively excite or refocus a slice from the entire object. Typically, NMR slice selection is achieved by selectively exciting only a small region of the object in a region perpendicular to the plane of interest.

Physical slicing of the test object has obvious disadvantages in that the object is destroyed and the slice selection cannot be changed without physically changing the slice in the spectrometer. However, physical slicing is a simple technique which can be used with the aforementioned MAS line-narrowing techniques.

Prior attempts to apply NMR slice selection to imaging systems which use MAS line narrowing techniques have met with problems. Although a wide variety of slice selection techniques are known for both liquid samples and solid objects, the time variations in the slice selection magnetic field gradient used for MAS imaging makes these prior art techniques inappropriate for slice selection in MAS imaging.

One of the most straightforward approaches to MAS imaging is to create two magnetic field gradients which are both orthogonal to the spinning axis and orthogonal to each other. The field gradients are generated by means of known winding configurations called Golay coils. By applying quadrature sinusoidal currents to each set of gradient windings having frequencies which are the same as the spinning frequency, a magnetic field gradient is created which rotates with the sample. Consequently, when the magnetic fields are viewed from the sample, they appear to be static and the imaging experiment proceeds in a manner analogous to conventional non rotating imaging experiments.

For slice selection, a natural approach is to design the experiment to select slices perpendicular to the spinning axis. The most direct construction for generating the required slice selection gradient field along the spinner axis is a conventional coil geometry called a Maxwell pair which consists of two planar coils physically arranged parallel to each other on either side of the image plane of interest. The coils are located so that their axes are collinear and correspond to the center of the desired image. An image is then acquired in a plane parallel to the coil planes. The easiest way to apply such a coil arrangement to a MAS NMR system is to wrap the coils around the housing in which an MAS rotor containing the object spins. Consequently, the coils are oriented in such a manner that they are perpendicular to the spinning axis and are canted at the magic angle with respect to the main static magnetic field. The gradient coils are driven with a D.C. current so that, in the absence of rotation, the object experiences a linear gradient field along the rotor axis. However, the field strength is still dependent on the X and Y position.

Unfortunately, since the gradient coils are positioned at an angle to the main static magnetic field, as the sample rotates during the actual experiment, the main field adds or subtracts from the gradient field so that the overall magnetic field gradient in the static field direction is not constant but oscillates. By carefully designing the gradient coils, it is possible to produce a constant gradient along the rotor axis in the presence of the main static field, but the specially designed coils are no longer simple in construction.

In addition, the modulation of the dipolar couplings, chemical shifts and susceptibility shifts caused by the MAS technique also effectively sweeps the NMR resonance frequency through a relatively wide range of frequencies even in the presence of a constant magnetic field. Consequently, a slice selection scheme which depends on selective excitation of a small region of the object would, in fact, include a much larger region than is desirable due to the expanded resonance frequency range even in the presence of a constant magnetic field gradient.

Accordingly, it is an object of the present invention to provide a method for slice selection in an NMR solids imaging system.

It is another object of the present invention to provide a method for slice selection in an NMR solids imaging system which is suitable for use with the magic angle spinning technique.

It is yet another object of the present invention to provide a method for slice selection in an NMR MAS solids imaging system which does not use complicated gradient coil designs.

It is another object of the present invention to provide a method for slice selection in an NMR MAS solids imaging system which does not require physically slicing the test object.

It is still another object of the present invention to provide a method for slice selection in an NMR MAS solids imaging system by applying an RF pulse sequence to the object during an imaging experiment.

It is a further object of the present invention to provide a method for slice selection in an NMR MAS solids imaging system by utilizing a multiple pulse RF pulse sequence in conjunction with an oscillating magnetic field gradient.

It is yet a further object of the present invention to provide a method for slice selection in an NMR MAS solids imaging system in which a multiple pulse RF pulse sequence refocuses chemical shifts but imaging information is preserved by a time variant gradient field.

SUMMARY OF THE INVENTION

The foregoing problems are solved and the foregoing objects are achieved in one illustrative embodiment of the invention in which a multiple pulse RF pulse sequence applied in the presence of an oscillating magnetic field gradient enables slice selection in a magic angle spinning system. Slice selectivity is produced by a series of RF pulses, some of which introduce a nutation that coherently adds for only a selected slice plane of the sample and averages to zero in other areas and some of which average certain gradient induced modulations so that only those object areas in the selected slice contribute to the output. The pulse train is applied in a manner synchronous with rotor rotation so that rotation induced modulations average to zero over one or more rotor rotation periods.

More particularly, an oscillating magnetic field gradient with a period equal to twice the rotor period is applied to the sample. A sequence of RF $\pi$ pulses refocus chemical and susceptibility shifts and thereby avoid distortions due to these terms; the pulses are applied once during each MAS cycle period, so that the oscillations of the chemical shift and dipolar coupling frequency variations with rotor orientation are unimportant and average out over every other rotor cycle. The magnetic field gradient is inverted at each RF pulse occurrence so that the RF pulse train does not refocus the spatial information and a series of $\epsilon$ pulses produces slice selectivity.

DETAILED DESCRIPTION OF THE PREFERRED EMBODIMENT

Figure 1A:
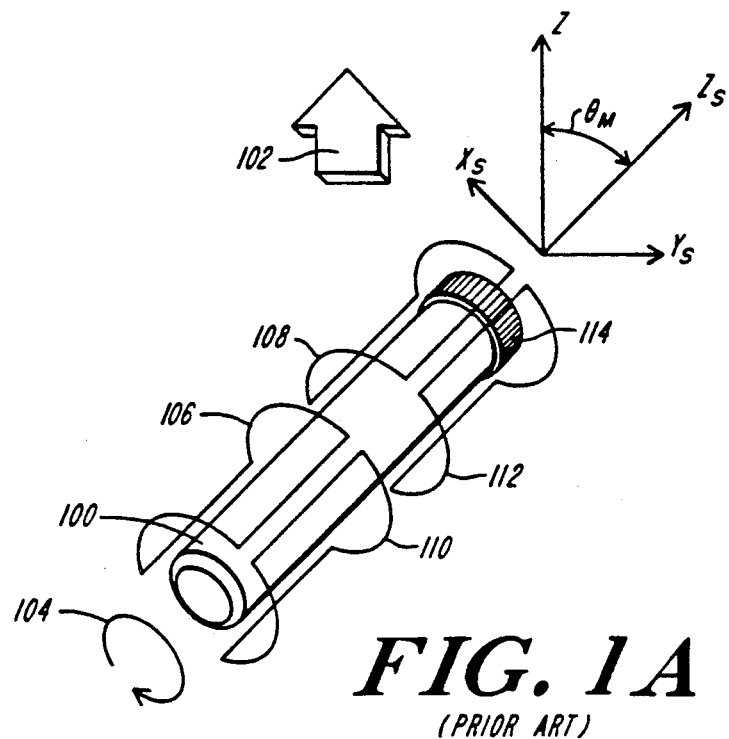
FIG. 1A is a schematic illustration of a typical prior art physical rotor arrangement for performing NMR MAS imaging showing the coils used to generate gradient fields.
Figure 1B:
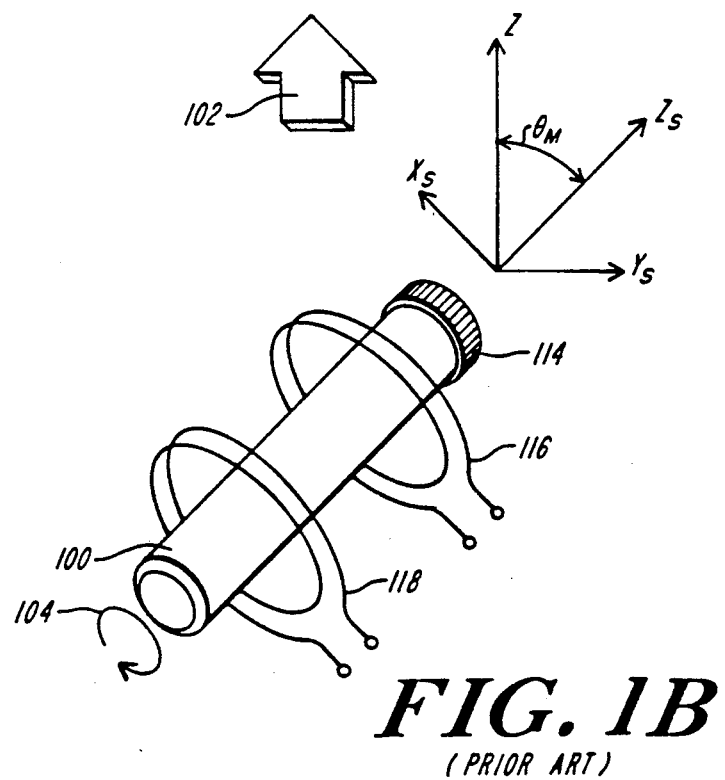
FIG. 1B is a schematic illustration of the prior art rotor arrangement shown in FIG. 1A showing only the coils used to generate a gradient field for slice selection.

FIGS. 1A and 1B show, in schematic form, a portion of a prior art NMR spectrometer which utilizes magic angle spinning. In general, in such a system, the test sample is placed inside a hollow rotor 100 which may illustratively be comprised of a ceramic material that will not interfere with the imaging process. In a typical solids imaging system, rotor 100 is placed inside a stator housing (not shown) which contains a pair of air bearings (not shown) that support rotor 100 and allow it to rotate. An air jet is then directed against vanes 114 affixed to one end of rotor 100 causing it to spin as indicated by arrow 104 at a relatively rapid rate (typically 4,000 to 8,000 Hz). In order to simplify FIG. 1, the stator housing and the air bearings have been omitted, but their construction and operation is well known to those skilled in the art.

In accordance with conventional NMR techniques, the rotor system is placed in a strong, static and uniform magnetic field indicated by arrow 102. For convenience in the discussion which follows, a Cartesian coordinate system (X,Y,Z) is used to describe the rotor system in which the Z-axis points along the field direction, 102. A separate coordinate system ($X_s$, $Y_s$, $Z_s$) is used to describe the fields with respect to the stator (canted at the magic angle with respect to the field direction) with the $Z_s$-axis pointing along the rotor rotation axis and a third coordinate system ($X_r$, $Y_r$, $Z_r$) is used to describe the fields with relation to the rotor (and the sample).

Using this notation, since the rotor is rotating with respect to the stator:

$$Z_r = Z_s \tag{1}$$

$$X_r = X_s \cos(\omega_r t + \phi) + Y_s \sin(\omega_r t + \phi) \tag{2}$$

$$Y_r = X_s \sin(\omega_r t + \phi) - Y_s \cos(\omega_r t + \phi) \tag{3}$$

where $\omega_r$ is the rotor angular velocity and $\phi$ is an arbitrary phase angle.

As mentioned above, the rotation axis ($Z_s$ and $Z_r$) of rotor 100 is oriented at the magic angle $\phi_m$ of 54° 44' to the static magnetic field direction Z (in the direction of arrow 102). The magic angle $\phi_m$ is the angle at which the second Legendre polynomial of cos $\phi$ averages to zero so that rotation at this angle reduces the broadening in the NMR resonance peaks due to chemical shift anisotropy (in some cases, broadening due to homonuclear dipolar coupling is also reduced) so that image resolution is increased.

Magic angle spinning is a well-known technique used in producing NMR spectra of solids. In order to use such a technique to generate NMR images, as mentioned above, it is necessary to impose position related magnetic gradients across the object to be imaged. One simple and prior art method of adapting a magic angle spinning NMR spectrometer for imaging is to utilize a separate set of magnetic coils to generate the required field gradients and to cant the gradient magnetic coils physically at the magic angle. Referring to FIG. 1A, a known set of coils called a Golay gradient set (consisting of coils 106, 108, 110 and 112) is wrapped around the stator housing (not shown in FIG. 1A) to create a field gradient perpendicular to the spinning axis $Z_s$ of rotor 100. For simplicity, only a single Golay coil set is shown. Another identical coil set oriented 90° to the set shown is used to generate another gradient field orthogonal to the field created by coil set 106–112. In addition, for simplicity the Golay coil sets in FIG. 1A are shown to be approximately the same length as rotor 100, but as is well known, the outer ends of the coil sets would actually extend far beyond the rotor ends to avoid fringing field effects.

The Golay coils are driven with a current that establishes the required gradient. Only the Z-axis component of the gradient fields will result in frequency shift of the NMR output signal. Further, in order to use conventional imaging techniques, the Golay coils are driven so that the Z-axis component ($B_z$) of the field gradients with respect to the sample in the $X_r$ and $Y_r$ directions ($dB_z/dX_r$ and $dB_z/dY_r$) are time independent. Equations (1)–(3) indicate that, since the rotor is rotating with respect to the stator and the Golay coils wrapped around the stator, the field gradients must oscillate at the same frequency as the rotor spinning frequency in order for the field seen by the rotor and the sample to appear stationary.

The rotating gradient fields are generated by driving the Golay coil sets with sinusoidal quadrature currents to create fields that rotate in synchronism with the rotor. Therefore, with respect to the rotor, the fields appear to be stationary and a variety of imaging techniques can be used.

An additional $Z_s$ field gradient must be created in order to adapt the aforementioned apparatus for slice selection. As mentioned above, a simple method for generating a $Z_s$ field gradient for slice selection is to add a simple gradient coil set called a Maxwell Pair to the structure shown in FIG. 1A which coil set is illustrated as coils 118 and 116 in FIG. 1B (in FIG. 1B, the aforementioned Golay coil sets used for imaging have been omitted for clarity). Each of the Maxwell Pair coils is a planar coil which contains many turns (only two turns are shown for simplicity in FIG. 1B). When a properly-directed current is applied to each coil, the fields from the two coils superimpose so that a linear magnetic field gradient develops in a region between the two coils.

During the actual operation of the system when rotor 100 is spinning, D.C. currents are applied to coils 116 and 118 so that a magnetic field gradient is generated by the coils. Ideally, the slice selection field gradient should be proportional to $dB_z/dZ_s$ and the slice selection field components in the $X_s$ and $Y_s$ directions ($dB_z/dX_s$ and $dB_z/dY_s$) should be zero. If the rotor and its accompanying Maxwell pair were oriented with the spinning axis parallel to the main field Z axis, the coils would produce a field gradient proportional to $dB_z/dZ_s$; however, when the rotor and Maxwell pair are canted with respect to the Z axis (as in FIG. 1B), the coils do not produce a field proportional to $dB_z/dZ_s$, and $dB_z/dX_s$ and $dB_z/dY_s$ are not zero.

Figure 2A:
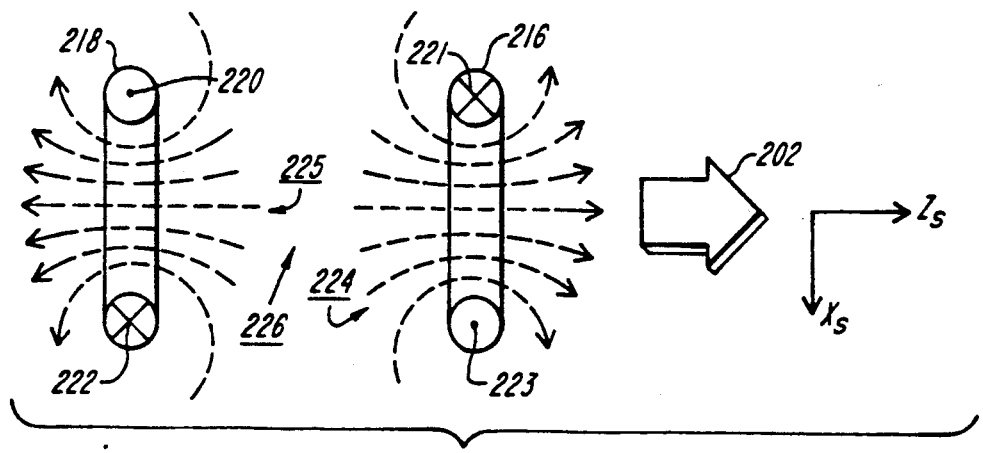
FIG. 2A is a schematic illustration of a prior art Maxwell Pair coil set oriented perpendicular to the main static field of an NMR imaging system.

More specifically, FIG. 2A is a schematic sectional diagram of a pair of Maxwell pair coils, 216 and 218, in which the coil axis is aligned along the direction of a constant static magnetic field represented by arrow 202. Each coil of coils 216 and 218 is comprised of many turns and the current flowing through the coils is indicated by reference dots 220 and 223 and crosses 221 and 222. In accordance with conventional designation, dots 220 and 223 indicate current flowing out of the plane of the paper and crosses 221 and 222 indicate current flowing into the plane of the paper. With the coil current direction oriented as shown in FIG. 2A, a magnetic field is generated as illustrated by field lines 224 around coil 216 and field lines 225 around coil 218. The superposition of the fields produced by coils 216 and 218 produces a linear field gradient in the area 226 between the coils.

Figure 2B:
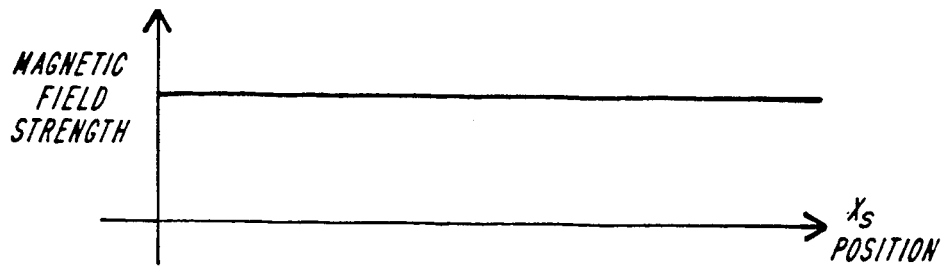
FIG. 2B is a schematic illustration of the magnetic field gradient strength versus position generated by the coil set shown in FIG. 2A in a plane perpendicular to the spinning axis.

Since the field direction generated by the Maxwell pair coils 216 and 218 is in the same direction as the main field 202, when the coils are oriented as shown in FIG. 2A ($Z_s = Z$), the main field adds to, or subtracts from the gradient field. However, since the field produced by the Maxwell pair is constant over the sample volume across a plane perpendicular to the axis of the coils (at least for points near the coil axis), the total field at any plane perpendicular to the rotation axis, $Z_s$, is constant. This is shown in FIG. 2B which illustrates the field with respect to the stator X axis ($X_x$) at a selected, fixed position along the $Z_s$ axis.

Figure 3A:
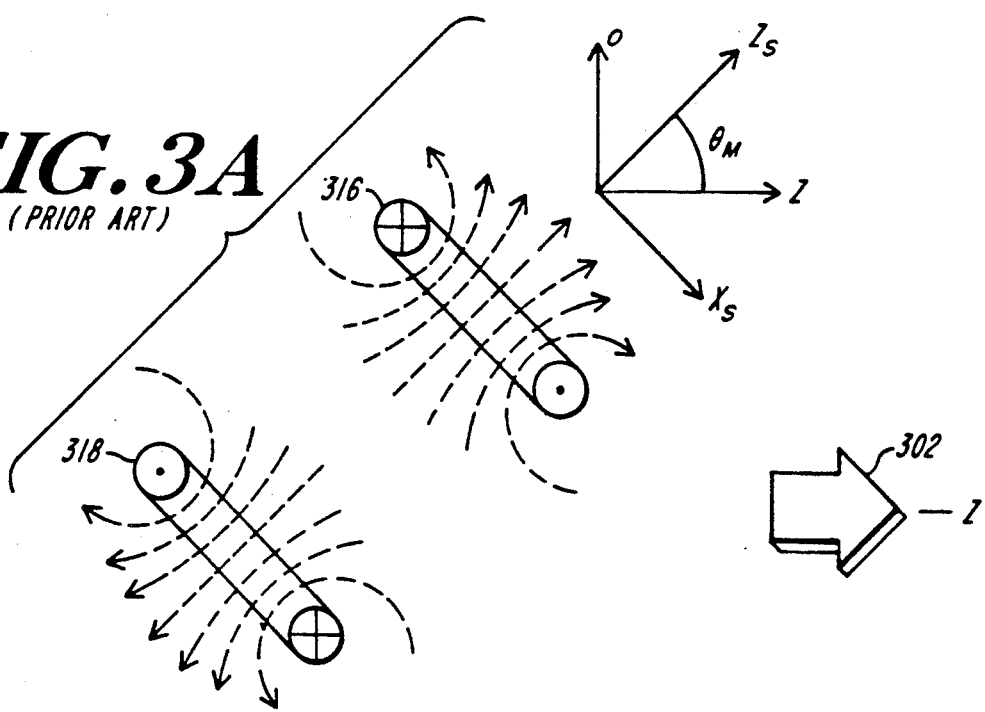
FIG. 3A is a schematic illustration of a prior art Maxwell Pair coil set oriented at the magic angle with respect to the main static field of an NMR imaging system.
Figure 3B:
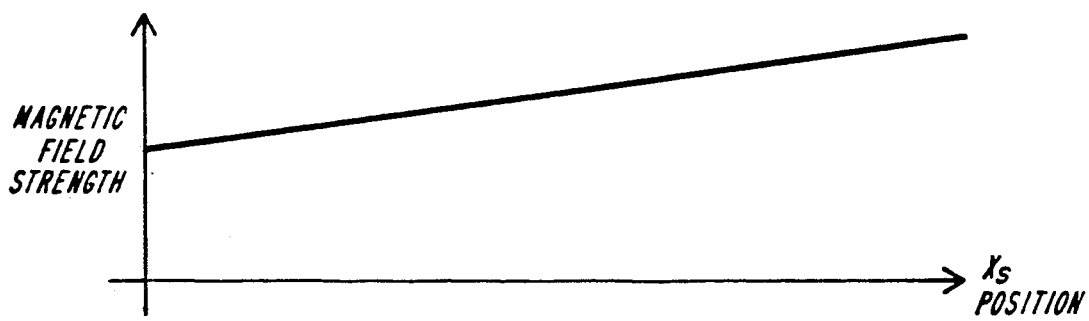
FIG. 3B is a schematic illustration of the magnetic field gradient strength versus position generated by the coil set shown in FIG. 3A in a plane perpendicular to the spinning axis.

In an actual magic angle spinning experiment, the main static field must be applied at the magic angle to the rotor axis to achieve the desired line narrowing results. Therefore, the actual situation appears as shown in FIGS. 3A and 3B. FIG. 3A shows the same coil pair as shown in FIG. 2A canted at the magic angle $\phi_m$ to the main static field represented by arrow 302.

Figure 4:
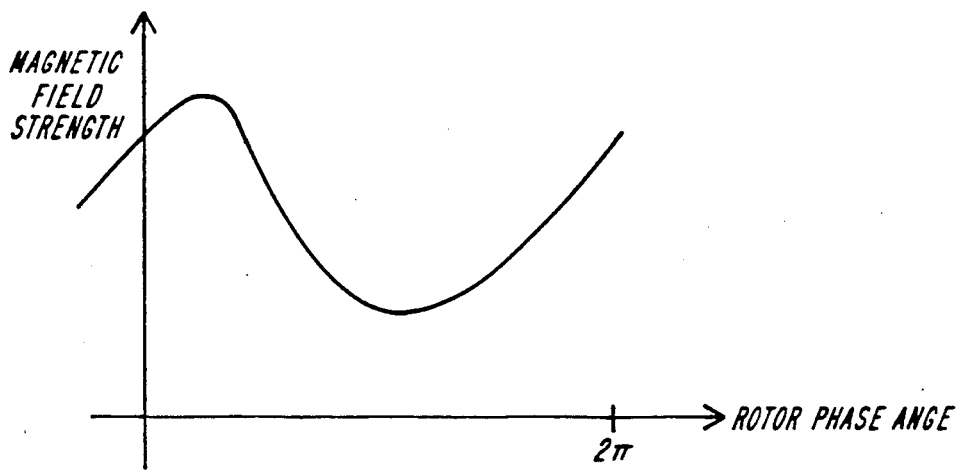
FIG. 4 is a schematic illustration of the prior art magnetic/field gradient strength at a fixed off axis position versus the rotor phase angle illustrating how the magnetic field gradient changes as the rotor rotates.

The direction of the gradient field generated by the Maxwell pair 316 and 318 no longer aligns with the main magnetic field so that the resulting field now has components in the $X_s$, $Y_s$ and $Z_s$ directions. Consequently, the total field at any plane perpendicular to the rotation axis, $Z_s$, is no longer constant. This is shown in FIG. 3B which illustrates the change in the gradient field with respect to the stator X-axis ($X_s$). As the stator rotates, sample portions that lie off the $Z_s$ axis will pass through gradient fields with different amplitudes so that at any given position, the field will change with the rotor position as shown in FIG. 4. Therefore, the field at any given off-axis position will oscillate as the rotor rotates.

In accordance with an aspect of the invention, a novel oscillating gradient and RF pulse combination is applied to the magic angle spinning apparatus shown in FIGS. 1A and 1B which overcomes the rotation induced, gradient oscillation (in the slice direction) problem. The new gradient/RF combination effectively causes the perturbations caused by the oscillating gradient to time-average to zero over a rotor rotation period. The RF pulses refocus chemical and susceptibility shifts and thereby avoid distortions due to these terms and are applied once each rotor cycle so that the oscillations of the chemical shift and dipolar coupling with rotor orientation are unimportant and average out over every other cycle. The magnetic field gradient is used to encode the spatial position of each spin and is inverted at each RF pulse time so that the RF pulse train does not refocus spatial information. An additional series of short RF pulses are used to implement a DANTE style selective excitation of a particular slice.

Figure 5A:
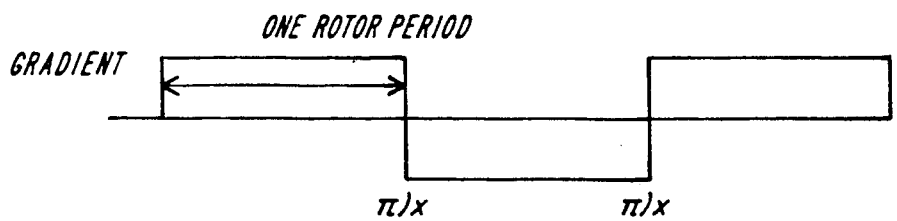
FIG. 5A is a schematic illustration of an oscillating magnetic field gradient applied to the rotating object in accordance with the invention.
Figure 5B:
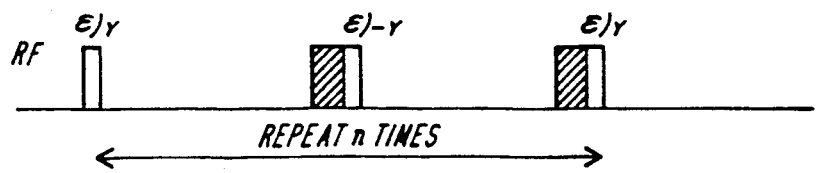
FIG. 5B is a schematic illustration of an RF pulse sequence applied to the rotating object in conjunction with the field gradient shown in FIG. 5A in accordance with the invention.

The magnetic field gradient as a function of time used in the inventive method is shown in detail in FIG. 5A and the RF pulse sequence is shown in FIG. 5B. The field gradient is applied by means of the Maxwell Pair coils 116 and 118 shown in FIG. 1B. The RF pulse sequence applied implements a selective excitation which is functionally similar to the known DANTE selective excitation method. The prior art DANTE method is described in detail in an article by G. Bodenhausen, R. Freeman and G.A. Morris, *Journal of Magnetic Resonance*, v. 23, p. 171 (1976) and "Selective Excitation in Fourier Transform Nuclear Magnetic Resonance", G. A. Morris and R. Freeman, *Journal of Magnetic Resonance*, v. 29, p. 433 (1978), which articles are hereby incorporated by reference.

As described in the aforementioned articles, for liquid sample experiments, in which the main static field is applied along the Z axis by convention, the known DANTE RF pulse sequence consists of a series of m short (length $t_p$) RF pulses along the Y-axis separated by free spin evolution periods (length $t_1$) during which no pulses are applied with the condition that $m\omega_1 t_p = \omega/2$ where $\pi_1$ is the Larmor angular velocity corresponding to the RF field strength of the applied pulses. It is assumed that the RF field strength is uniform across the liquid sample.

It is convenient to regard this DANTE pulse sequence as performing a series of two-step rotations on the subject nuclei. These rotations are indicated by the notation $[(\omega_o+\omega_{cs})t_1 I_z, \omega_1 t_p I_y]^m$, where $\omega_o$ is an offset frequency and $\omega_{cs}$ is the chemical shift frequency. This notation indicates that each pulse of the DANTE pulse sequence effectively causes a rotation about the Z-axis through the angle $(\omega_o+\omega_{cs})t_1$ followed by a rotation about the Y axis through an angle $\omega_1 t_p$. The entire pulse sequence then repeats the two individual rotation sequence m times.

As discussed in the articles, the DANTE pulse sequence is selective in emphasizing resonance lines produced by certain offsets and chemical shifts while suppressing other resonance lines. This selectivity is a result of these two orthogonal rotations destructively interfering everywhere except for the angles $(\omega_o+\omega_{cs})t_1 = k2\pi$, where k is an integer. For those nuclear spins with resonance offsets and chemical shifts which evolve through an angle of $k2\pi$ during the free spin evolution period, $t_1$, between pulses there is no effective Z-axis rotation, and the $m(\omega_1 t_p)$ Y-axis pulses accumulate to yield an effective ($\pi/2$) Y axis pulse. For other combinations of offsets and chemical shifts, the nuclear spin rotations due to the Y axis pulses are coherently averaged to zero and do not accumulate and the magnetization remains in the neighborhood of the Z-axis at the end of the DANTE sequence. Consequently, these latter spins do not contribute to the output.

It was also recognized in the prior art that the basic DANTE pulse sequence could be converted into a slice-selection sequence for liquids by applying a magnetic field gradient so that the Z-axis rotation is also dependent on the field gradient. In the simplest implementation of a slice-selecting DANTE sequence, the RF pulse sequence is applied to a sample in the presence of a static magnetic field gradient of strength q Hz/cm, and the spacing of selected slices is given by $(gt_1)^{-1}$. For distortion less slice selection, the magnetic field gradient is selected so that the Z-axis rotation due to the field gradient is much larger than the rotation due to the offsets and chemical shift effects.

For solid samples, a simple DANTE pulse sequence cannot be directly used for slice selection because, as previously mentioned, the homonuclear dipolar coupling in solids is much larger than in liquids and obscures the gradient induced shifts.

In accordance with the invention, a DANTE based RF pulse sequence is used in the presence of a magnetic field gradient so that the Z-axis rotation depends on the magnetic field gradient. Magic angle spinning is used to suppress anisotropic chemical shifts and, in some cases, homonuclear dipolar coupling broadenings. The magnetic field gradient is applied to the solid sample using Maxwell Pair coils canted at the magic angle to the main static field as shown in FIG. 1B. The coil currents are oscillating so that the multiple-pulse cycle which averages the inhomogeneous interactions does not also average the gradient interaction.

As previously discussed, this coil configuration results in an oscillating Z-axis field component, but rotation induced modulation is avoided by averaging the output over a rotor rotation period. Chemical shift effects are avoided by using a "Carr-purcell" type pulse sequence to refocus chemical shift perturbations. If dipolar couplings that are not averaged by the MAS technique are present, a homonuclear dipolar decoupling multiple pulse cycle is used to suppress them.

More particularly, as shown in FIG. 5A, an oscillating magnetic field gradient with a period equal to twice the rotor period is applied to the sample. As shown in FIG. 5B, a series of short FR $\epsilon$ pulses and string of RF $\pi$ pulses are also applied in synchronism with the oscillating field gradient. The x and y notations associated with the pulses denote RF phases By convention, the applied fields are referenced to a Cartesian coordinate system with the main static field pointing along the Z axis. Accordingly, the applied RF fields are polarized 90° to the main field or along the X and Y axes. Since the X and Y axes are arbitrary directional designations, the pulse designations of X and Y are taken to represent relative phases of the signals. For example a RF pulse designated as an X pulse has a relative phase shift of 90° with respect to an RF pulse designated as a Y pulse. Similarly, an RF pulse designated as $-Y$ has a relative phase shift of 180° with respect to an Y pulse.

The $\pi$ pulses are applied along the X-axis and refocus chemical and susceptibility shifts and thereby avoid distortions due to these terms. Since the pulses are applied once during each MAS cycle period, the oscillations of the chemical shift and dipolar coupling Hamiltonians with rotor orientation are unimportant and average out over every other rotor cycle. The magnetic field gradient is used to encode the spatial position of each spin and, as shown in FIG. 5A, the gradient is inverted at each RF $\pi$ pulse occurrence so that the RF pulse train does not refocus the spatial information.

The inventive RF pulse sequence is similar to a conventional DANTE sequence because a series of short $\epsilon$ pulses are used to introduce a nutation for slice selection. The $\epsilon$ pulses are applied alternately along the Y axis and the Y axis and occur once every cycle so that MAS induced modulations do not interfere with slice selection. Since the $\epsilon$ pulses are applied with $\pi$ pulses in between, the phase of the $\epsilon$ pulses is alternated so that their net effect is cumulative. The condition for generating a selective $\pi/2$ pulse is that the total number n of $\epsilon$ pulses fulfill the condition $n\epsilon = \pi/2$.

With the pulse train and gradient shown in FIGS. 5A and 5B, in accordance with the discussion of the DANTE sequence above, the slice planes selected are those areas in which the gradient induced spin evolution has evolved by an integer multiple of $2\pi$ in the free spin evolution time interval between $\epsilon$ pulses.

Thus, the inventive method allows slice selection in magic-angle spinning images without the necessity of designing special gradient coils which would yield a distortion free gradient when oriented at the magic angle. In addition, the inventive method is compatible with a wide range of gradient coil geometries and can be used as part of a volume selected spectroscopy method.

Although only one embodiment of the inventive method has been described, several obvious modifications and changes will be immediately apparent to those skilled in the art. For example, a phase shift of the RF pulses may be introduced to produce a spatial offset of the selected slice. Instead of applying the $\epsilon$ pulses at every rotor period as shown in FIG. 5B, $\epsilon$ pulses may be applied at multiples of two rotor rotation periods without changing the method of operation.

Alternatively , a Z-DANTE scheme may be employed Further, although a Carr-Purcell type pulse sequence is illustrated, other conventional and well known pulse cycles for refocusing chemical and susceptibility shifts may be employed Similarly, additional known multiple-pulse cycles which average homonuclear dipolar couplings may be incorporated into the inventive method. The inventive method may also be preceded by a conventional contrast enhancement step.

In addition, the inventive slice selection method can be combined with various homonuclear dipolar decoupling multiple RF pulse sequences in order to narrow the line widths in a conventional manner. Conventional multiple pulse sequences such as the MREV-8 sequence are described in more detail in "DANTE Slice Selection for Solid-State NMR Imaging", D.G. Cory, J.B. Miller and A.N. Garroway, *Journal of Magnetic Resonance*, v. 90, (1990) Other line narrowing RF pulse sequences suitable for use with the invention are described in detail in United States patent application Ser. No. 07/642,397, filed on Jan. 17, 1991 by David G. Cory and entitled "Method for Increasing Resolution in an NMR Solids Imaging System" and assigned to the assignee of the present invention. The disclosures of the aforementioned journal article and patent application are hereby incorporated by reference.

These modifications and other obvious changes are intended to be covered by the following claims.

What is claimed is:

1. In an NMR magicangle-spinning solids:imaging system in which an object is placed in a main static magnetic field having a field direction and physically rotated with a predetermined rotation period about an axis positioned at an angle of 54° 44' to said main magnetic field, at least one magnetic field having a field gradient perpendicular to said rotation axis is applied to said object and NMR induced magnetization is detected in a direction transverse to the main static magnetic field direction, a method for slice selection comprising the steps of:

A. applying to said object a slice selection magnetic field gradient having a direction parallel to said rotation axis, said slice selection magnetic field gradient periodically reversing in direction with a period equal to twice said rotation period; and B. applying a periodic sequence of radio frequency pulses to said object, said sequence having a period equal to a multiple of said rotation period and each of the pulses in said sequence comprising an RF pulse applied in the X direction and an RF pulse applied alternately in the Y and Y directions, where the X and Y directions are perpendicular to the main magnetic field direction, an X RF pulse has a relative phase shift of 90° with respect to a Y RF pulse and a $-Y$ RF pulse has a relative phase shift of 180° with respect to an Y pulse 2. In an NMR magic-angle spinning solids imaging system, the method for slice selection according to claim 1 wherein step A comprises the steps of:

A1. applying to said object a slice selection magnetic field gradient which is linear along said axis.

3. In an NMR magic-angle spinning solids imaging system, the method for slice selection according to claim 1 wherein step B comprises the steps of:

B1. applying a periodic sequence of radio-frequency pulses to said object, said periodic sequence of pulses consisting of a first pulse alternating with a second pulse, said first pulse comprising an $\pi$ pulse in the X direction followed substantially immediately by an $\epsilon$ pulse in the Y direction and said second pulse comprising an $\pi$ pulse in the X direction followed substantially immediately by an $\epsilon$ pulse in the $-Y$ direction.

4. In an NMR magic-angle spinning solids imaging system, the method for slice selection according to claim 1 wherein step B comprises the steps of:

B2. applying a periodic sequence of radio-frequency pulses to said object, said sequence having $\epsilon$ pulses applied periodically with a period equal to said rotation period.

5. In an NMR magic angle spinning solids imaging system, the method for slice selection according to claim 1 wherein step B comprises the steps of:

B3. applying a periodic sequence of radio frequency pulses to said object, said sequence having e pulses applied periodically with a period equal to a multiple of twice said rotation period.

6. In an NMR magic-angle spinning solids imaging system, the method for slice selection according to claim 1 further comprising the step of:

C. applying a periodic sequence of radio frequency pulses to said object, said sequence of pulses being selected to reduce the effects of homonuclear dipolar couplings.

7. In an NMR magic-angle spinning solids imaging system, the method for slice selection according to claim 6 wherein step C comprises the step of:

C1. applying an MREV 8 periodic sequence of radio frequency pulses to said object.

8. In an NMR magic-angle spinning solids imaging system, the method for slice selection according to claim 6 wherein step C comprises the steps of:

C2. applying a sequence of radio frequency pulses to said object, said sequence being composed of at least two composite inversion pulses, each of said composite inversion pulses having a predetermined non zero effective field in the same direction and wherein the sign of the effective field in the first pulse is different from the sign of the effective field in the second pulse; and C3. varying the strength of said magnetic field gradient applied in step A during step C2.

9. A method for generating an image from a preselected portion of a solid object in an NMR magic angle spinning solids imaging system comprising the steps of:

A. placing said object in a main static magnetic field having a field direction;

B. physically rotating said object with a predetermined rotation period about an axis positioned at an angle of 54° 44′ to said main magnetic field;

C. applying to said object at least one magnetic field having a field gradient perpendicular to said rotation axis;

D. applying to said object a slice selection magnetic field gradient having a direction parallel to said rotation axis, said slice selection magnetic field gradient periodically reversing in direction with a period equal to twice said rotation period;

E. applying a periodic sequence of radio-frequency pulses to said object, said sequence having a period equal to a multiple of said rotation period and each of the pulses in said sequence comprising an RF pulse applied in the X direction and an RF pulse applied alternately in the Y and -Y directions, where the X and Y directions are perpendicular to the main magnetic field direction, an X RF pulse has a relative phase shift of 90° with respect to a Y RF pulse and a -Y RF pulse has a relative phase shift of 180° with respect to an Y pulse; and F. detecting the NMR induced magnetization in a direction transverse to the main static magnetic field direction.

10. A method for generating an image from a preselected portion of a solid object according to claim 9 wherein step D comprises the steps of:

D1. applying to said object a slice selection magnetic field gradient which is linear along said axis.

11. A method for generating an image from a preselected portion of a solid object according to claim 9 wherein step E comprises the steps of:

E1. applying a periodic sequence of radio frequency pulses to said object, said periodic sequence of pulses consisting of a first pulse alternating with a second pulse, said first pulse comprising an $\pi$ pulse in the X direction followed substantially immediately by an $\epsilon$ pulse in the Y direction and said second pulse comprising an $\pi$ pulse in the X direction followed substantially immediately by an $\epsilon$ pulse in the Y direction.

12. A method for generating an image from a preselected portion of a solid object according to claim 9 wherein step E comprises the steps of:

E2. applying a periodic sequence of radio-frequency pulses to said object, said sequence having $\epsilon$ pulses applied periodically with a period equal to said rotation period.

13. A method for generating an image from a preselected wherein step E comprises the steps of:

E3. applying a periodic sequence of radio-frequency pulses to said object, said sequence having $\epsilon$ pulses applied periodically with a period equal to a multiple of twice said rotation period.

14. A method for generating an image from a preselected portion of a solid object according to claim 9 wherein step C comprises the steps of:

C1. applying to said object a first magnetic field having a first field direction and a first field gradient perpendicular to said rotation axis; and C2. applying to said object a second magnetic field having a field gradient perpendicular to said rotation axis and a second field gradient orthogonal to said first magnetic field gradient.

15. A method for generating an image from a preselected portion of a solid object according to claim 14 wherein step C further comprises the step of:

C3. applying said first magnetic field and said second magnetic field to said object so that said field gradient of said first magnetic field and said field gradient of said second magnetic field rotate around said rotation axis in synchronism with said object.

16. A method for generating an image from a preselected portion of a solid object according to claim 9 further comprising the step of:

G. applying a periodic sequence of radio frequency pulses to said object prior to detecting the NMR-induced magnetization, said sequence of pulses being selected to reduce the effects of homonuclear dipolar couplings.

17. A method for generating an image from a preselected portion of a solid object according to claim 16 wherein step G comprises the step of:

G1. applying an MREV-8 periodic sequence of radio frequency pulses to said object.

18. A method for generating an image from a preselected portion of a solid object according to claim 16 wherein step G comprises the steps of:

G2. applying a sequence of radio-frequency pulses to said object, said sequence being composed of at least two composite inversion pulses, each of said composite inversion pulses having a predetermined non zero effective field in the same direction and wherein the sign of the effective field in the first pulse is different from the sign of the effective field in the second pulse, and G3. varying the strength of said magnetic field gradient applied in step D during step G2.

19. A method for generating an image from a preselected portion of a solid object in an NMR magic angle spinning solids imaging system comprising the steps of:

A. placing said object in a main static magnetic field having a field direction;

B. physically rotating said object with a predetermined rotation period about an axis positioned at an angle of 54° 44′ to said main magnetic field;

C. applying to said object a first ma field having a first field direction and a first linear field gradient perpendicular to said rotation axis and rotating around said rotation axis in synchronism with said object;

D. applying to said object a second magnetic field having a field gradient perpendicular to said rotation axis and a second linear field gradient orthogonal to said first magnetic field gradient, said second field rotating around said rotation axis in synchronism with said object.

E. applying to said object a linear slice selection magnetic field gradient having a direction parallel to said rotation axis, said slice selection magnetic field gradient periodically reversing in direction with a period equal to twice said rotation period;

F. applying a periodic sequence of radio frequency pulses to said object, said sequence having a period equal to a multiple of said rotation period and comprising a first pulse alternating with a second pulse, said first pulse comprising an $\pi$ pulse in the X direction followed substantially immediately by an $\epsilon$ pulse in the Y direction and said second pulse comprising an $\pi$ pulse in the X direction followed substantially immediately by an $\epsilon$ pulse in the Y direction, where the X and Y directions are perpendicular to the main magnetic field direction, an X RF pulse has a relative phase shift of 90° with respect to a Y RF pulse and a -Y RF pulse has a relative phase shift of 180° with respect to an Y pulse; and G. detecting the NMR-induced magnetization in a direction transverse to the main static magnetic field direction.

20. A method for generating an image from a preselected portion of a solid object according to claim 19 wherein step F comprises the steps of:

F1. applying a sequence of radio-frequency pulses to said object, said sequence having $\epsilon$ pulses applied periodically with a period equal to said rotation period.

21. A method for generating an image from a preselected portion of a solid object according to claim 19 wherein step F comprises the steps of.

F2. applying a periodic sequence of radio frequency pulses to said object, said sequence having e pulses applied periodically with a period equal to a multiple of twice said rotation period.

22. A method for generating an image from a preselected portion of a solid object according to claim 19 further comprising the step of:

H. applying a periodic sequence of radio-frequency pulses to said object prior to detecting the NMR-induced magnetization, said sequence of pulses being selected to reduce the effects of homonuclear dipolar couplings.

23. A method for generating an image from a preselected portion of a solid object according to claim 22 wherein step H comprises the step of:

H1. applying an MREV-8 periodic sequence of radio frequency pulses to said object.

24. A method for generating an image from a preselected portion of a solid object according to claim 22 wherein step H comprises the steps of:

H2. applying a sequence of radio frequency pulses to said object, said sequence being composed of at least two composite inversion pulses, each of said composite inversion pulses having a predetermined non-zero effective field in the same direction and wherein the sign of the effective field in the first pulse is different from the sign of the effective field in the second pulse; and H3. varying the strength of said magnetic field gradient applied in step E during step H2.

* * * * *